(12) United States Patent
Chiu et al.

(10) Patent No.: US 11,368,130 B1
(45) Date of Patent: Jun. 21, 2022

(54) DIRECT CURRENT OFFSET PROTECTION CIRCUIT AND METHOD

(71) Applicant: Elite Semiconductor Microelectronics Technology Inc., Hsinchu (TW)

(72) Inventors: Hsin-Yuan Chiu, Hsinchu (TW); Hsiang-Yu Yang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/179,375

(22) Filed: Feb. 18, 2021

(51) Int. Cl.
*H03F 3/217* (2006.01)
*H03F 1/52* (2006.01)
*H03F 3/38* (2006.01)

(52) U.S. Cl.
CPC ............... *H03F 1/52* (2013.01); *H03F 3/217* (2013.01); *H03F 2200/03* (2013.01); *H03F 2200/351* (2013.01); *H03F 2200/375* (2013.01)

(58) Field of Classification Search
CPC ........ H03F 1/52; H03F 3/217; H03F 2200/03; H03F 2200/351; H03F 2200/375
USPC ....................................... 330/10, 251, 207 A
See application file for complete search history.

(56) References Cited

U.S. PATENT DOCUMENTS

| | | | |
|---|---|---|---|
| 7,078,964 B2 * | 7/2006 | Risbo | ...................... H03F 3/217 332/107 |
| 7,576,604 B2 | 8/2009 | Xu | |
| 7,692,488 B2 * | 4/2010 | Wong | ......................... H03F 1/52 330/10 |
| 8,847,677 B2 * | 9/2014 | Nagashima | ............. H03F 3/217 330/10 |
| 2005/0083116 A1 | 4/2005 | Risbo | |
| 2005/0151585 A1 | 7/2005 | Honda | |
| 2016/0309274 A1 | 10/2016 | Ma | |

FOREIGN PATENT DOCUMENTS

WO 2019/215095 A1 11/2019

\* cited by examiner

*Primary Examiner* — Hieu P Nguyen
(74) *Attorney, Agent, or Firm* — Winston Hsu

(57) ABSTRACT

A direct current (DC) offset protection circuit includes: a DC offset detection circuit and a control circuit. The DC offset detection circuit is arranged to detect whether a DC component exists in pulse-width-modulation (PWM) signals and accordingly generate a DC offset detection result. The control circuit is arranged to control an audio system according to the DC offset detection result. The DC offset detection circuit comprises a PWM polarity judgment circuit, a cascaded integrator-comb (CIC) filter and a DC offset judgment circuit. The PWM polarity judgment circuit is arranged to judge a polarity of complementary PWM signals and accordingly generate a polarity indication value. The CIC filter is arranged to generate a filter output signal by averaging a plurality of polarity indication values. The DC offset judgment circuit is arranged to generate the DC offset detection result by comparing the filter output signal with a predetermined DC threshold.

8 Claims, 5 Drawing Sheets

DIRECT CURRENT OFFSET PROTECTION CIRCUIT AND METHOD

BACKGROUND OF THE INVENTION

1. Field of the Invention

The present invention relates generally to audio systems, and more particularly, to a direct current offset protection circuit and method for detecting DC component and performing protection control in an audio system.

2. Description of the Prior Art

In audio systems, a standard design goal is the protection on circuits and components, one of which is output direct current (DC) offset protection. Typically, a DC offset voltage is defined as a DC voltage level at input or output terminals of a circuit when there is no voltage applied to input terminals of the circuit. The DC offset voltage can be introduced due to mismatch of the elements/components, component degradation over time, electrical overstress of the circuit or any other factors that will translate into a DC offset voltage at the output terminals. The DC offset voltage will lead to large DC current to pass through loudspeakers of the audio system, which may even cause irreversible damage to the loudspeakers. Additionally, the large DC current dissipation on the loudspeakers is likely to give rise to a risk of fire. In light of above, the DC offset voltage may negatively affect the audio system and needs to be minimized.

SUMMARY OF THE INVENTION

With this in mind, it is one object of the present invention to provide a DC offset protection circuit and method for an audio system. In various embodiments of the present invention, a DC offset detection mechanism is provided to detect DC components in PWM signals, which are typically used in a class-D amplifier based audio system. The DC offset detection mechanism of the present invention relies on a cascaded integrator-comb (CIC) filter to perform averaging calculation on samples of the PWM signals, thereby to detect the DC components in the PWM signals.

According to one embodiment of the present invention, a direct current (DC) offset protection circuit for use in an audio system is provided. The DC offset protection circuit comprises: a DC offset detection circuit and a control circuit. The DC offset detection circuit is arranged to detect whether a DC component exists in a plurality of pulse-width-modulation (PWM) signals and accordingly generate a DC offset detection result. The control circuit is arranged to control at least one part of the audio system according to the DC offset detection result. The DC offset detection circuit comprises a PWM polarity judgment circuit, a cascaded integrator-comb (CIC) filter and a DC offset judgment circuit. The PWM polarity judgment circuit is arranged to judge a polarity of a pair of complementary PWM signals in the PWM signals and accordingly generate a polarity indication values The CIC filter is arranged to generate a filter output signal by averaging the polarity indication values. The DC offset judgment circuit is arranged to generate the DC offset detection result by comparing the filter output signal with at least one predetermined DC threshold.

According to one embodiment of the present invention, a DC offset protection method for use in an audio system is provided. The DC offset protection method comprises: judging a polarity of a pair of complementary pulse-width-modulation (PWM) signals of a plurality of PWM signals and accordingly generating a polarity indication value; generating a filter output signal by averaging a plurality of polarity indication values with a CIC filter; generating a DC offset detection signal by comparing the filter output signal with at least one DC threshold; and controlling at least one part of the audio system according to the DC offset detection signal.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment", or "an example" means that a particular feature, structure or characteristic described in connection with the embodiment or example is included in at least one embodiment of the present embodiments. Thus, appearances of the phrases "in one embodiment", or "in an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

Figure 1:
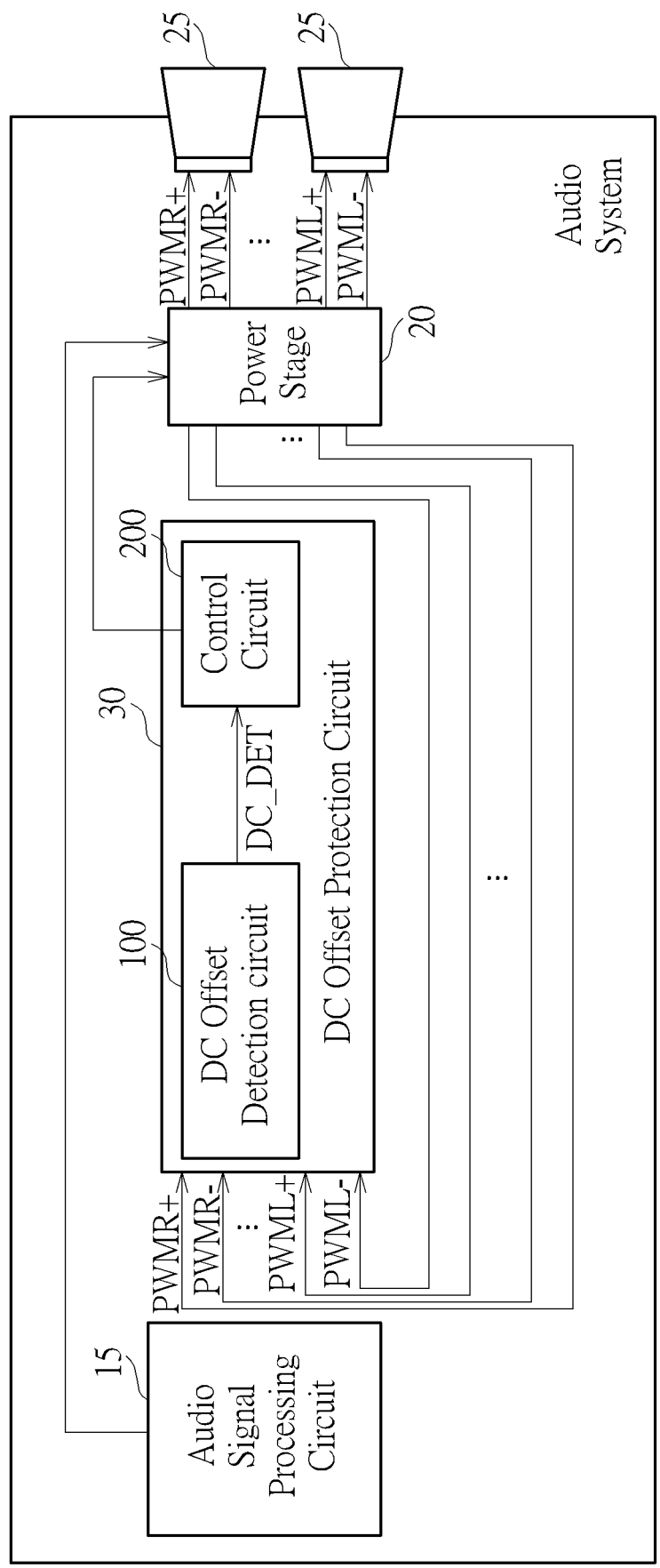
FIG. 1 illustrates a schematic view of a DC offset protection circuit for use in an audio system according to one embodiment of the present invention.

Please refer to FIG. 1, which illustrates a direct current (DC) offset protection circuit for use in an audio system according to one embodiment of the present invention. As illustrated, an audio system 10 comprises (but not limited to) an audio signal processing circuit 15, a power stage 20, a plurality of loudspeakers 25, a DC offset protection circuit 30. The DC offset protection circuit 30 includes a DC offset detection circuit 100 and a control circuit 200. The DC offset detection circuit 100 is arranged to detect whether or not DC components exists in the audio system 10. The control circuit 200 is arranged to control at least one part of the audio system 10 in response to a detection result of the DC offset detection circuit 100.

In one embodiment, the audio signal processing circuit 15 may comprise (not shown) sample rate conversion units, equalizers, volume control units, dynamic range control units, clipping units, filters and pulse-width modulation (PWM) pulse generators in order to perform a series of audio signal processing on input digital audio signals and accordingly drive the loudspeakers 25 in a switching manner (via PWM signals). The audio system 10 may contain N audio channels. The audio signal processing circuit 15 outputs 2N PWM signals that correspond to the N audio channels and drives N loudspeakers. In a typical case, there will be four PWM signals PWML+, PWML−, PWMR+ and PWMR− for a pair of stereo loudspeakers 25, where the four PWM signals includes two pairs of complementary signals, and one pair of the complementary PWM signals PWML+ and PWML− are intended to drive the loudspeaker 25 at a left (L) channel, while the other one pair of the complementary PWM signals PWMR+ and PWMR− are intended to drive the loudspeaker 25 at a right (R) channel. The PWM signals are further outputted by the power stage 20. The power stage 20 could comprise a plurality of power gates controlled by the PWM signals, and accordingly provide PWM to drive the loudspeakers 25. Please note that the number of channels, loudspeakers and PWM signals mentioned hereinafter in the audio system 10 is not intended to limit the present invention in scope.

The DC offset detection circuit 100 is coupled to the power stage 20 and detect whether any of the PWM signals outputted by the power stage 20 contains a DC component. In response to the detection of the DC component, the DC offset detection circuit 100 will generate a detection signal DC_DET to notify the control circuit 200. According to the detection signal DC_DET, the control circuit 200 could control the power stage 25 to stop providing PMW signals to the loudspeakers 25 (if the DC component is detected). According to various embodiments of the present invention, the power stage 25 would stop providing PWM signals to all of the loudspeakers 25 in the audio system 10 even if only one channel contains the DC component. Alternatively, the power stage 25 would stop providing PWM signals to a specific loudspeaker 25 that is associated with the channel containing the DC component. According to various embodiments of the present invention, the control circuit 200 may further shut down other parts of the audio system 10 when the DC component is detected.

Figure 2:
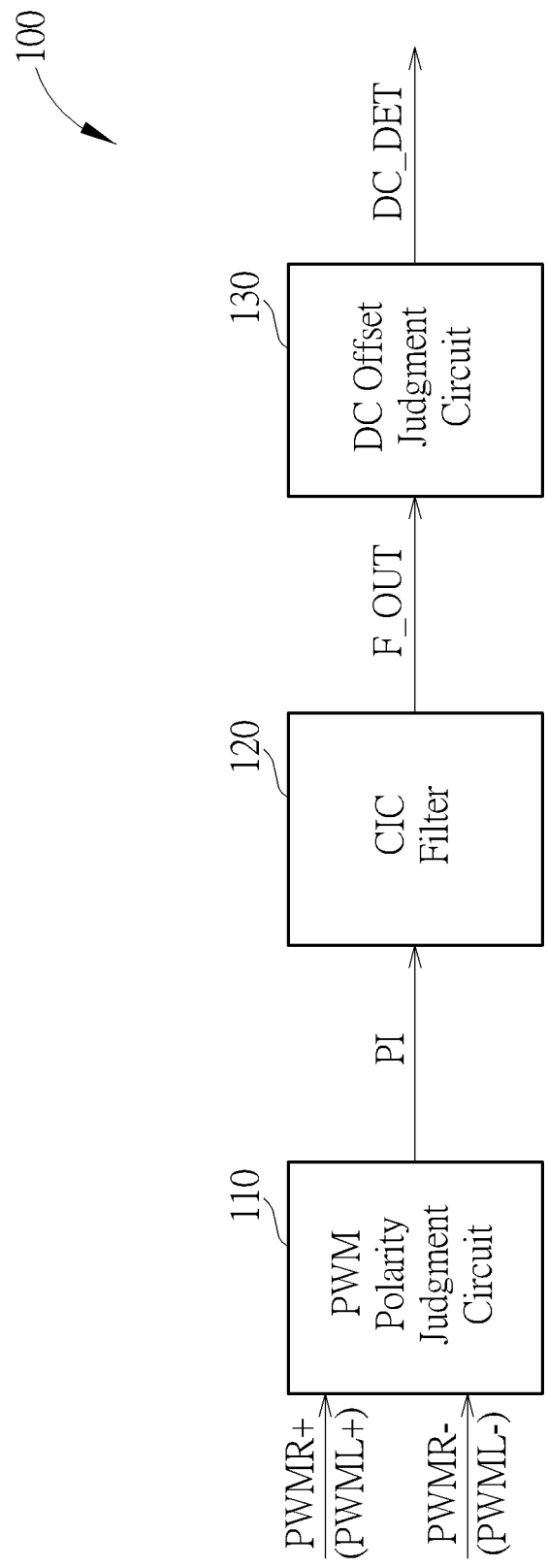
FIG. 2 illustrates a schematic view of a DC offset detection circuit in a DC offset protection circuit according to one embodiment of the present invention.

FIG. 2 illustrates a DC offset detection circuit 100 according to one embodiment of the present invention. As illustrated, the DC offset detection circuit 100 comprises a PWM polarity judgment circuit 110, a cascaded integrator-comb (CIC) filter 120 and a DC offset judgment circuit 130. The PWM polarity judgment circuit 110 is arranged to detect polarities of PWM signals outputted by the power stage 20 and accordingly output a plurality of polarity indication values PI, wherein the polarity indication value PI is indicative of the polarity of one pair of complementary PWM signals PWMR+ and PWMR− (or PWML+ and PWML−) in the PWM signals outputted by the power stage 20. In one embodiment, the PWM polarity judgment circuit 110 generates the polarity indication value PI according to a relationship between a sample of the positive PMW signal PWMR+ with a sample of the negative PWM signal PWMR−. For example, the positive PMW signal PWMR+ and the negative PWM signal PWMR− will be sampled at a specific edge of a reference clock (not shown). Accordingly, the PWM polarity judgment circuit 110 generates the polarity indication value PI according to instant samples of the positive PMW signal PWMR+ and the negative PWM signal PWMR−. Depending on their relationship (i.e., the sample of the positive PMW signal PWMR+ is greater than, equal to, or smaller than the negative PWM signal PWMR−), the polarity indication values PI will be different.

In one embodiment, the polarity indication values could be in form of floating point numbers with polarity. In addition, a number of bits of the samples of the complementary PWM signals PWMR+ and PWMR− are smaller than a number of bits of the polarity indication values. For example, the sample of the positive PWM signal PWMR+ or the negative PWM signal PWMR− could be 2-bit data, while the polarity indication values could be 3-bit data.

Figure 3:
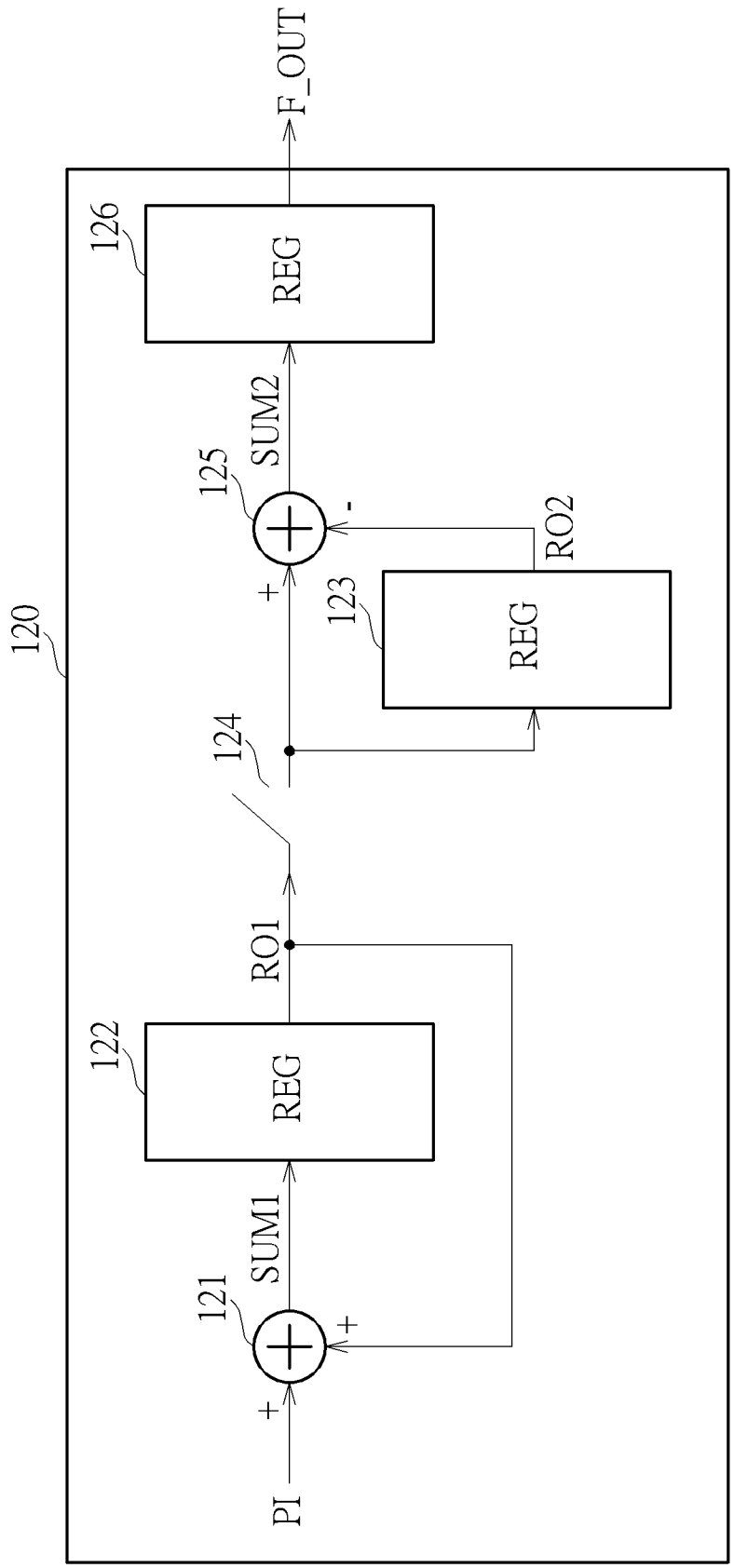
FIG. 3 illustrates an exemplary schematic view of a CIC filter for use in a DC offset detection circuit according to one embodiment of the present invention.

The polarity indication value PI will be outputted to the CIC filter 120 each time the complementary PWM signals PWMR+ and PWMR− are sampled. The CIC filter 120 is arranged to average a plurality of polarity indication values PI over a period of time to generate a filter output signal F_OUT. FIG. 3 illustrates an exemplary schematic view of a CIC filter for use in the DC offset detection circuit 100 according to one embodiment of the present invention. As illustrated, the CIC filter 120 comprise a first adding circuit 121, a first register circuit 122, a second register circuit 123, a switching circuit 124, a second adding circuit 125 and a third register circuit 126.

The first adding circuit 121 is coupled to the PWM polarity judgment circuit 110 and arranged to add the polarity indication value PI to a first register output RO1 from the first register circuit 122, thereby to generate a first adding result SUM1. The first register circuit 122 is coupled to the first adding circuit 121 and arranged to store the first adding result SUM1 and accordingly provide the first register output RO1. During a certain period of time, the polarity indication values PI will be accumulated in the first register circuit 122. The second register circuit 123 is coupled to the first register circuit 122 and arranged to store the first register output RO1 and accordingly provide the second register output RO2. The switching circuit 124 is coupled between the first register circuit 122 and the second register circuit 123, and arranged to conduct a path between the first register circuit 122 and the second register circuit 123 after a predetermined period of time expires. For example, after the first adding circuit 121 has added the polarity indication values PI to the first register output RO1 for 2^22 times, the switching circuit 124 will conduct the path. The second adding circuit 125 is coupled to the switching circuit 124 and the second register circuit 123 and is arranged to subtract the second register output RO2 from the first register output RO1 to provide a second adding result SUM2 when the switching circuit 124 conducts the path. The third register circuit 126 is coupled to the second adding circuit 125 and the DC offset judgment circuit 130 and is arranged to store the second adding result SUM2 and accordingly provide a third register output as the filter output signal F_OUT. In short, the CIC filter 120 is arranged to perform a moving averaging calculation on the polarity indication values PI over a period of time and the filter output signals F_OUT is the calculation result.

Figure 4A:
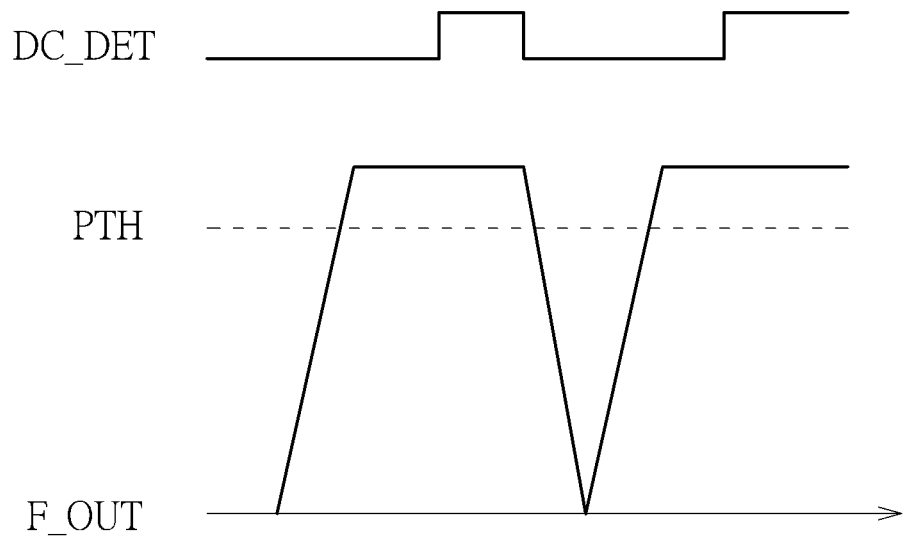
FIG. 4A and FIG. 4B illustrate waveforms of a DC offset detection result, a filter output signal in combination with a positive DC offset threshold and a negative DC offset threshold.
Figure 4B:
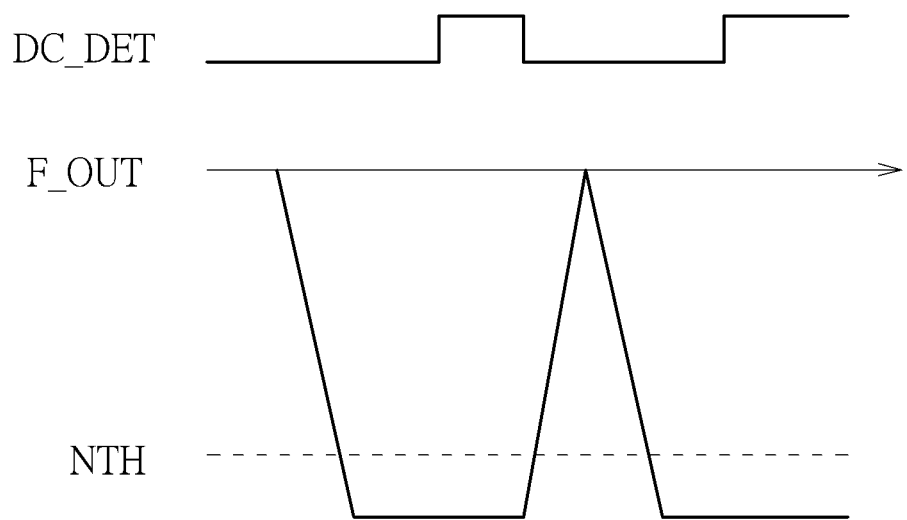

The DC offset judgment circuit 130 is arranged to compare the filter output signal F_OUT with at least one of a positive DC offset threshold PTH and a negative DC offset threshold NTH to generate the DC offset detection result DC_DET, wherein the DC offset detection result DC_DET is indicative of a positive DC component or a negative DC component exists in the PWM signals outputted by the power stage 20. FIG. 4A and FIG. 4B illustrate waveforms of the detection result DC_DET, the filter output signal F_OUT in combination with the positive DC offset threshold PTH and the negative DC offset threshold NTH. As illustrated, the DC offset detection result DC_DET will be asserted either when the filter outputs signal F_OUT exceeds the positive DC offset threshold PTH or when the filter outputs signal F_OUT exceeds the negative DC offset threshold NTH. In one embodiment, with the positive DC offset threshold PTH and the negative DC offset threshold NTH could be determined by power rating of the loudspeakers 25.

Figure 5:
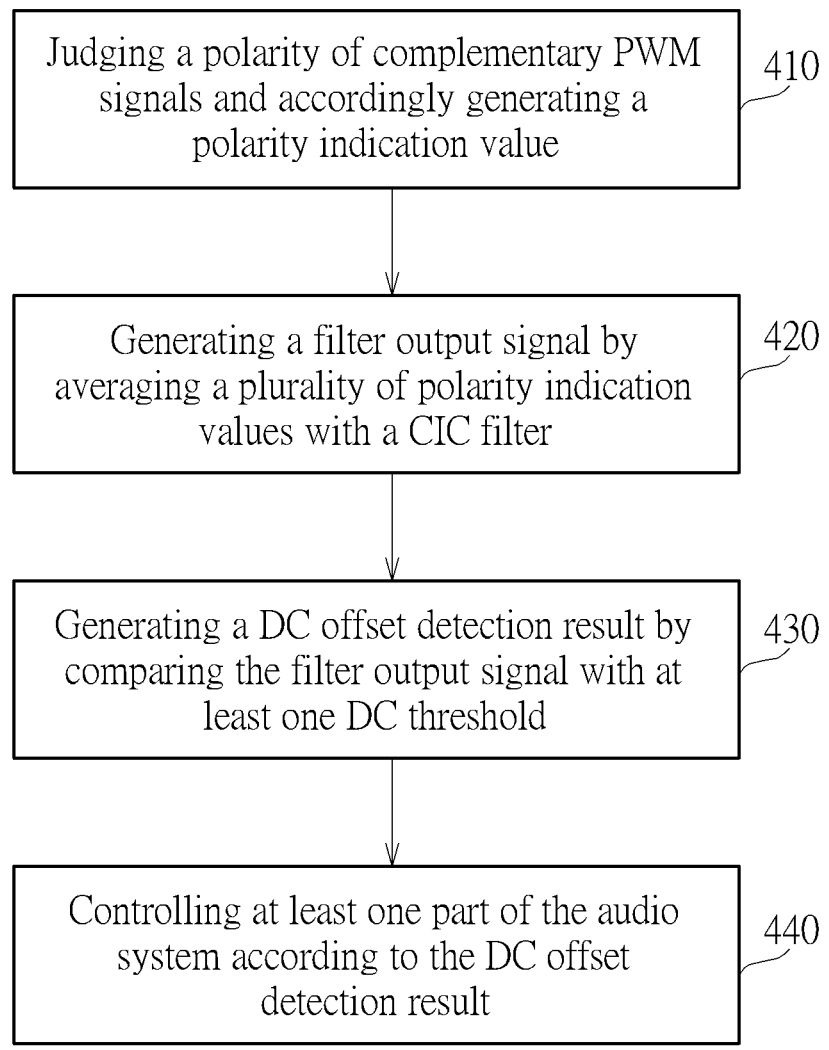
FIG. 5 illustrates a flow chart of a DC offset protection method according to one embodiment of the present invention.

FIG. 5 illustrates a flow chart of a DC offset protection method according to one embodiment of the present invention. The flow comprises following steps:

Step 410: judging a polarity of a PWM signal and accordingly generating a polarity indication value;

Step 420: generating a filter output signal by averaging a plurality of polarity indication values with a CIC filter;

Step 430: generating a DC offset detection signal by comparing the filter output signal with a DC threshold;

Step 440: controlling an audio system according to the DC offset detection signal.

As principles and operations of the DC offset protection circuit 30 has been detailed in the above descriptions, further explanation on principles and operations of steps 410-440 are omitted here for the sake of brevity. Please note that the DC offset protection method of the present invention may have more extra steps in addition to steps 410-440 in the purpose of for performing DC offset detection and protection.

In conclusion, the present invention provides a DC offset protection circuit and method. The DC offset detection mechanism of the present invention detects DC components in PWM signals of a class-D amplifier based audio system and relies on a CIC filter to perform averaging calculation on samples of the PWM signals, thereby to detect the DC components in the PWM signals and prevent the potential DC current from damaging the loudspeakers or the parts of the audio system.

Embodiments in accordance with the present embodiments may be implemented as an apparatus, method, or computer program product. Accordingly, the present embodiments may take the form of an entirely hardware embodiment, an entirely software embodiment (including firmware, resident software, micro-code, etc.), or an embodiment combining software and hardware aspects that may all generally be referred to herein as a "module" or "system." Furthermore, the present embodiments may take the form of a computer program product embodied in any tangible medium of expression having computer-usable program code embodied in the medium.

The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A direct current (DC) offset protection circuit for use in an audio system, comprising:
   a DC offset detection circuit, arranged to detect a DC component in a plurality of pulse-width modulation (PWM) signals, comprising:
      a PWM polarity judgment circuit, arranged to judge a polarity of complementary PWM signals and accordingly generate a polarity indication value, wherein a number of bits of samples of the complementary PWM signals are smaller than a number of bits of the polarity indication value; and the polarity indication values are floating point numbers with polarities;
      a CIC filter, coupled to the PWM polarity judgment circuit, arranged to generate a filter output signal by averaging a plurality of polarity indication values; and
      a DC offset judgment circuit, coupled to the CIC filter, arranged to compare the filter output signal with at least one DC offset threshold and accordingly generate a DC offset detection result; and
   a control circuit, coupled to the DC offset judgment circuit, and arranged to control at least one part of the audio system according to the DC offset detection result.

2. The DC offset protection circuit of claim 1, wherein the PWM polarity judgment circuit generates the polarity indication value according to a relationship between a sample of a positive PMW signal of the complementary PWM signals with a sample of a negative PWM signal of the complementary PWM signals.

3. The DC offset protection circuit of claim 1, wherein the CIC filter comprises:
   a first adding circuit, coupled to the PWM polarity judgment circuit, arranged to add the polarity indication value to a first register output, thereby to generate a first adding result;
   a first register circuit, coupled to the first adding circuit, arranged to store the first adding result and accordingly provide the first register output;
   a second register circuit, coupled to the first register circuit, arranged to selectively store the first register output and accordingly provide the second register output;
   a switching circuit coupled between the first register circuit and the second register circuit, arranged to conduct a path between the first register circuit and the second register circuit after a predetermined period of time expires;
   a second adding circuit, coupled to the switching circuit and the second register circuit, arranged to subtract the second register output from the first register output to provide a second adding result when the switching circuit conducts the path; and a third register circuit, coupled to the second adding circuit and the DC offset judgment circuit, arranged to store the second adding result and accordingly provide a third register output as the filter output signal.

4. The DC offset protection circuit of claim 1, wherein the DC offset judgment circuit is arranged to compare the filter output signal with at least one of a positive DC offset threshold and a negative DC offset threshold to generate the DC offset detection result, wherein the DC offset detection result is indicative of a positive DC component or a negative DC component existing in the PWM signals.

5. A direct current (DC) offset protection method for use in an audio system, comprising:
   judging a polarity of complementary PWM signals and accordingly generating a polarity indication value, wherein a number of bits of samples of the complementary PWM signals are smaller than a number of bits of the polarity indication value; and the polarity indication values are floating point numbers with polarities;
   generating a filter output signal by averaging a plurality of polarity indication values with a CIC filter;
   generating a DC offset detection result by comparing the filter output signal with at least one DC threshold; and
   controlling at least one part of the audio system according to the DC offset detection result.

6. The DC offset protection method of claim 5, wherein the step of
   generating the polarity indication value comprises:
   generating the polarity indication value according to a relationship between a sample of a positive PMW signal of the complementary PWM signals with a sample of a negative PWM signal of the complementary PWM signals.

7. The DC offset protection method of claim 5, wherein the step of generating the filter output signal by averaging the polarity indication values with the CIC filter comprises:
   utilizing a first adding circuit to add the polarity indication value to a first register output, thereby to generate a first adding result;
   utilizing a first register circuit to store the first adding result and accordingly provide the first register output;
   utilizing a second adding circuit to subtract a second register output from the first register output after the predetermined period of time expires and accordingly providing a second adding result;
   utilizing a second register circuit to store the first register output after a predetermined period of time expires and accordingly providing the second register output; and
   utilizing a third register circuit to store the second adding result and accordingly providing a third register output as the filter output signal.

8. The DC offset protection method of claim 5, wherein the step of generating the DC offset detection result by comparing the filter output signal with the at least one DC threshold comprises: comparing the filter output signal with at least one of a positive DC offset threshold and a negative DC offset threshold to generate the DC offset detection result, wherein the DC offset detection result is indicative of a positive DC component or a negative DC component existing in the PWM signals.

* * * * *